United States Patent
Chiba et al.

(10) Patent No.: US 12,399,222 B2
(45) Date of Patent: *Aug. 26, 2025

(54) BATTERY UNIT

(71) Applicant: HONDA MOTOR CO., LTD., Tokyo (JP)

(72) Inventors: Kazuki Chiba, Saitama (JP); Masahiro Ohta, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 264 days.

This patent is subject to a terminal disclaimer.

(21) Appl. No.: 17/818,719

(22) Filed: Aug. 10, 2022

(65) Prior Publication Data

US 2023/0090747 A1    Mar. 23, 2023

(30) Foreign Application Priority Data

Sep. 22, 2021  (JP) .................................. 2021-154383

(51) Int. Cl.
*G01R 31/36* (2020.01)
*G01R 31/388* (2019.01)
(Continued)

(52) U.S. Cl.
CPC ....... *G01R 31/3648* (2013.01); *G01R 31/388* (2019.01); *G01R 31/392* (2019.01); *G01R 31/396* (2019.01)

(58) Field of Classification Search
CPC .................. G01R 31/3648; G01R 31/392; G01R 31/396; G01R 31/388
See application file for complete search history.

(56) References Cited

U.S. PATENT DOCUMENTS

2010/0052617 A1    3/2010  Aridome et al.
2012/0166116 A1    6/2012  Yoshida et al.
(Continued)

FOREIGN PATENT DOCUMENTS

CN    105676134 A    6/2016
CN    112924872 A    6/2021
(Continued)

OTHER PUBLICATIONS

Notification of Reasons for Refusal issued Jul. 2, 2024 in the JP Patent Application No. 2021-154383.
(Continued)

*Primary Examiner* — Lam S Nguyen
(74) *Attorney, Agent, or Firm* — CKC & Partners Co., LLC

(57) ABSTRACT

The battery unit includes: a battery module including a battery cell; a battery heat flow detector configured to detect a heat flow of the battery cell; a storage configured to store heat flow HF vs. state of charge SOC initial characteristics of the battery cell; and a battery state estimator configured to estimate a state of health SOH of the battery cell. The battery state estimator measures, during charge of the battery cell, HF vs. SOC present characteristics of the battery cell, based on the detected heat flow of the battery cell, and estimates a state of health SOH of the battery cell, from a ratio between a length mAh of a line segment between peaks of differential characteristics of the measured HF vs. SOC present characteristics and a length mAh of a line segment between peaks of differential characteristics of the stored HF vs. SOC initial characteristics.

7 Claims, 11 Drawing Sheets

(51) Int. Cl.
    *G01R 31/392*     (2019.01)
    *G01R 31/396*     (2019.01)

(56) References Cited

U.S. PATENT DOCUMENTS

| | | |
|---|---|---|
| 2020/0350617 A1 | 11/2020 | Endo |
| 2022/0320615 A1 | 10/2022 | Ohta et al. |
| 2023/0091279 A1 | 3/2023 | Kazuki et al. |

FOREIGN PATENT DOCUMENTS

| | | |
|---|---|---|
| JP | 2010271171 A | 12/2010 |
| JP | 5044511 B2 | 10/2012 |
| JP | 5287844 B2 | 9/2013 |
| JP | 2015522899 A | 8/2015 |
| JP | 2016133413 A | 7/2016 |
| JP | 2019216074 A | 12/2019 |
| JP | 2022155231 A | 10/2022 |
| JP | 2023045893 A | 4/2023 |
| WO | 2013043123 A1 | 3/2013 |
| WO | 2014021957 A2 | 2/2014 |
| WO | 2018235846 A1 | 12/2018 |

OTHER PUBLICATIONS

G.Assat et al., "Probing the thermal effects of voltage hysteresis in anionic redox-based lithium-rich cathoodes using sothermal calorimetry", Nature Energy, vol. 4, Aug. 2019, pp. 647-656.
Office Action issued May 29, 2025 in the CN Patent Application No. 202210958553.2.

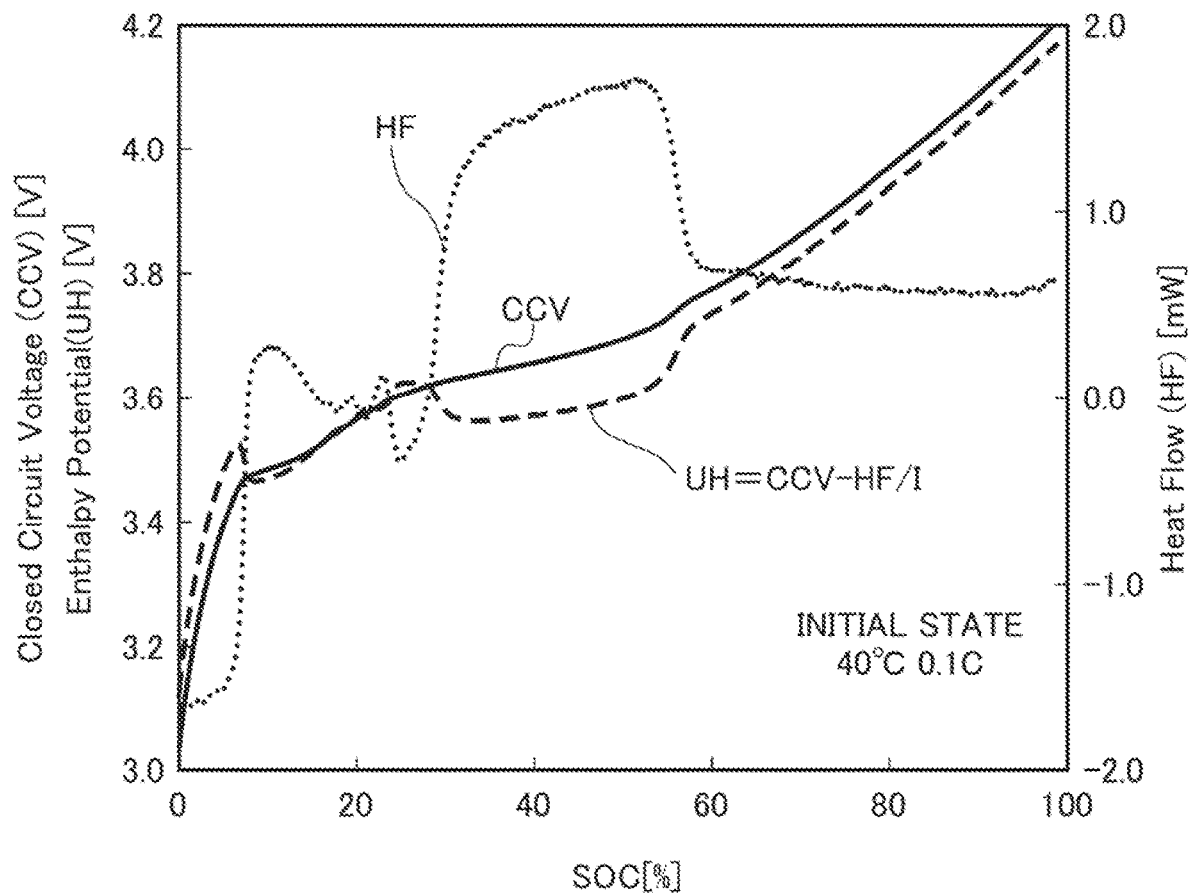

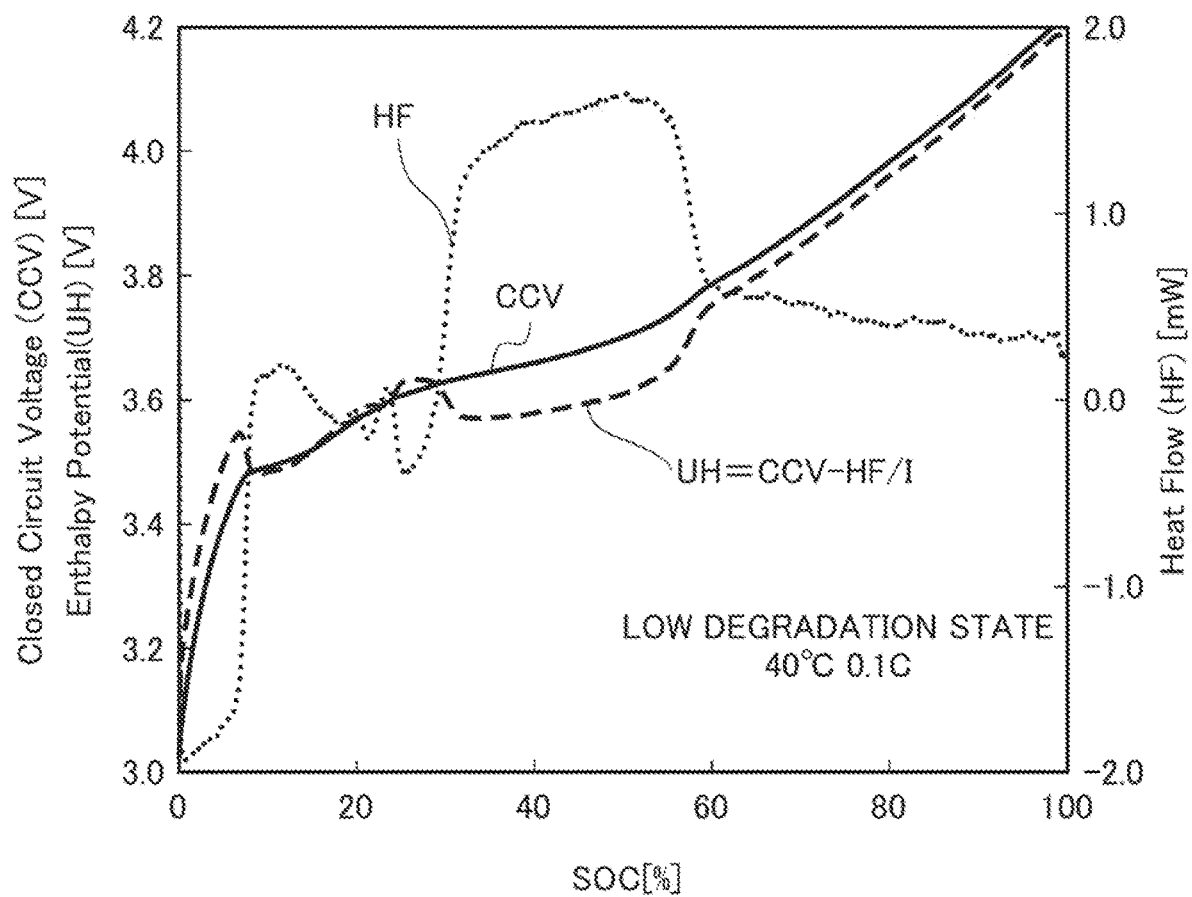

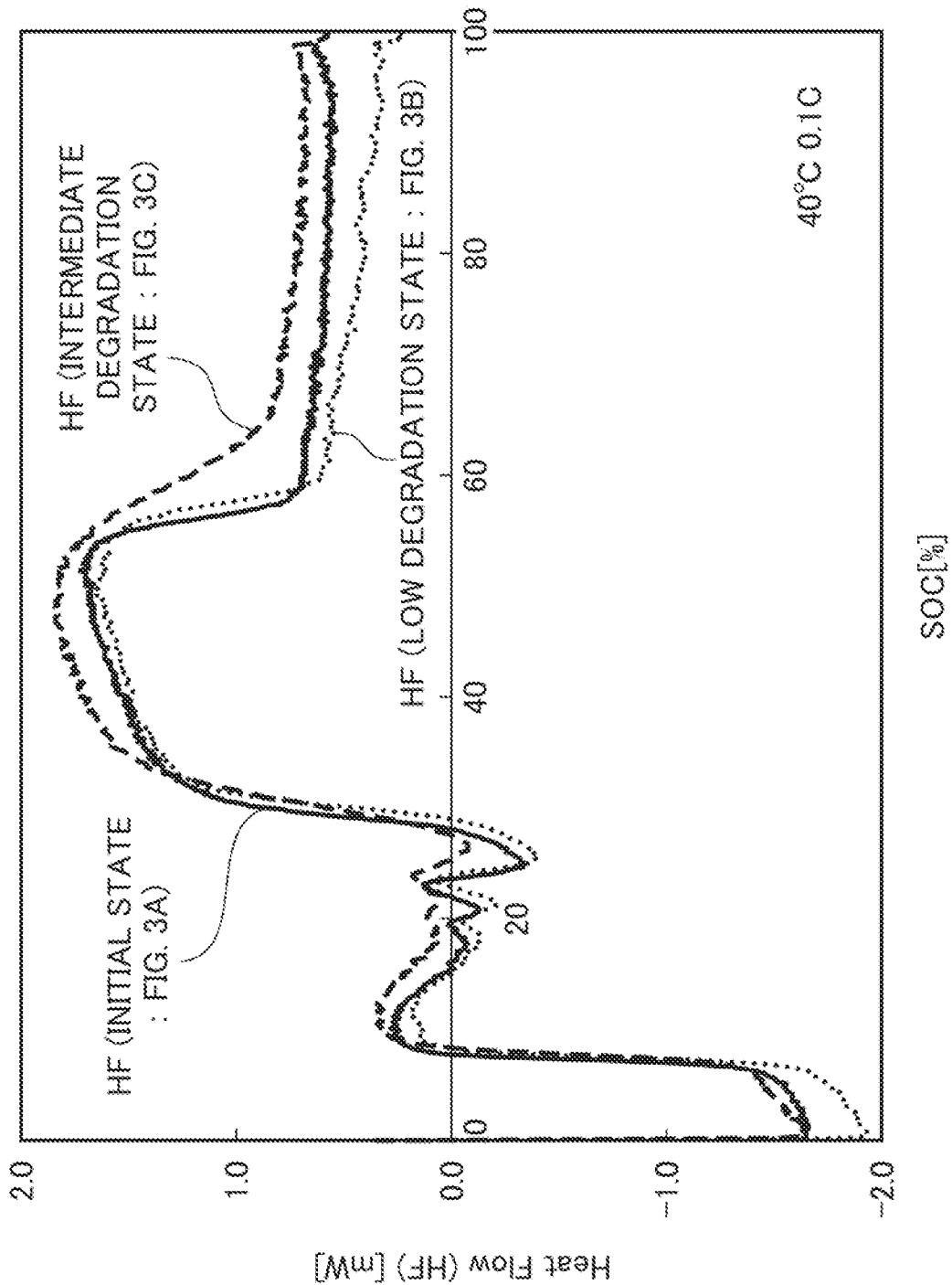

BATTERY UNIT

This application is based on and claims the benefit of priority from Japanese Patent Application No. 2021-154363, filed on 22 Sep. 2021, the content of which is incorporated herein by reference.

BACKGROUND OF THE INVENTION

Field of the Invention

The present disclosure relates to a battery unit.

Related Art

In recent years, battery units have been widely used as energy sources for driving widespread electric devices and electronic devices of various sizes, such as automobiles, personal computers, and information terminals. In particular, in the field of automobiles, interest in electric vehicles is growing, and use of the battery units as vehicle-mountable devices is under study, in order to reduce adverse global environmental impact and in order to reduce $CO_2$ and improve the global environment from the viewpoint of climate-related hazards and natural disasters.

A technique for estimating a state of battery cells in a battery unit, such as a state of charge (SOC) or a state of health (SOH) plays an important role in efficiently and safely using the electronic devices and electrical devices. For example, it has been known that a state of battery cells such as the SOC or the SOH correlates with a voltage of the battery cells. There are known techniques according to which a state of battery cells, such as the SOC or the SOH, is estimated based on a voltage of the battery cells (for example, see Patent Documents 1 and 2).

Patent Document 1: Japanese Patent No. 5287844
Patent Document 2: Japanese Patent No. 5044511
Non-Patent Document 1: G. Assat et al., "Probing the thermal effects of voltage hysteresis in anionic redox-based lithium-rich cathodes using isothermal calorimetry", Nature Energy, volume 4, August 2019, pp. 647-656

SUMMARY OF THE INVENTION

The present disclosure relates to a technique for estimating the SOH as a state of a battery cell. The SOH is defined by the following formula:

SOH={present (degraded state) full charge capacity (SOC 0%-100%)}/{initial full charge capacity (SOC 0%-100%)}

This formula is conventionally known as the simplest way to estimate the SOH. Specifically, the initial full charge capacity (SOC 0%-100%) is stored in advance, and the full charge capacity (SOC 0%-100%) at present (in a degraded state) is measured during actual use, and the SOH is estimated according to the above formula.

However, during actual use, charge is not carried out from a SOC of 0%. Further, during actual use, charge is not always carried out until a SOC of 100% is reached. Therefore, in order to measure a full charge capacity (SOC 0%-100%) at present (in a degraded state), it is necessary, for example, to stop the use of a battery cell, discharge the battery cell until a SOC of 0% is reached, and then charge it until the SOC reaches 100% from 0%. By performing charge with a constant current and at a low rate, the capacity mAh can be calculated from the charge current mA and the charge time h.

In this respect, the present inventors have devised a process for estimating the SOH based on a part of closed circuit voltage (CCV) vs. SOC characteristics. For example, in the case of a lithium-ion battery including graphite as a material for the negative electrode, CCV vs. SOC differential characteristics, i.e., differential characteristics d(CCV)/d(SOC) of CCV characteristics CCV=f(SOC) with respect to the SOC, have peaks caused by phase transition or the like. In the case of a lithium-ion battery whose SOC 0% is mainly determined depending on a potential of the negative electrode, a length mAh of a line segment between these peaks correlates with an overall capacity mAh of the battery cells.

Therefore, according to the devised process for estimating the SOH, a length mAh of a line segment between peaks of differential characteristics of CCV vs. SOC initial characteristics is stored in advance. Thereafter, a length mAh of a line segment between peaks of differential characteristics of CCV vs. SOC present (degraded state) characteristics is measured at the time of charge during actual use, and the SOH is estimated according to the following formula.

SOH={length mA*h* of line segment between peaks of differential characteristics of CCV vs. SOC present(degraded state)characteristics}/{length mA*h* of line segment between peaks of differential characteristics of CCV vs. SOC initial characteristics}

Since the charge during actual use is performed with a constant current and at a low rate, the length mAh of the line segment between peaks can be calculated from the charge current mA and the charge time h. The devised SOH estimation process does not require charge to be carried out from a SOC of 0% or up to a SOC of 100%, and therefore, the SOH estimation process can be employed at the time of charge during actual use.

However, the peaks of the CCV vs. SOC differential characteristics have relatively small magnitudes, relatively obtuse spectra, and relatively small S/N ratios. For this reason, it is expected that a relatively low estimation accuracy can be achieved by the devised process for estimating the SOH of a battery cell based on the CCV vs. SOC differential characteristics.

An object of the present disclosure is to provide a battery unit that increases accuracy of SOH estimation for a battery cell.

The present inventors have found that a SOC of battery cells correlates also with a heat flow HF of the battery cells that is caused by, for example, phase transition of an active material of an electrode material. The present inventors have further found the following. The length mAh of a line segment between peaks of HF vs. SOC differential characteristics correlates with the overall capacity mAh of battery cells, and in comparison with the CCV vs. SOC differential characteristics, the HF vs. SOC differential characteristics have feature in which:

peaks have larger magnitudes, shaper spectra, and lager S/N ratios;
the number of the peaks is greater and the intervals between the peaks are shorter; and
plus peaks and minus peaks have a respective specific pattern, and even when the battery cells are degraded, the specific pattern maintains a certain pattern, in other words, the peaks are unlikely to deviate in position with respect to the SOC even when the battery cells are degraded.

Accordingly, the present inventors have devised a method of estimating the SOH of a battery cell based on the heat flow of the battery cell, specifically, the HF vs. SoC characteristics, and more specifically, the HF vs. SOC differential characteristics.

A battery unit according to a first aspect of the present disclosure includes: a battery module including a battery cell; a battery heat flow detector configured to detect a heat flow HF of the battery cell; a storage configured to store HF vs. state of charge SOC initial characteristics of the battery cell; and a battery state estimator configured to estimate a state of health SOH of the battery cell. The battery state estimator measures, during charge of the battery cell, HF vs. SOC present characteristics of the battery cell, based on the heat flow HF of the battery cell detected by the battery heat flow detector, and estimates a first state of health SOH(Real; R) of the battery cell, from a ratio between a length mAh of a line segment between peaks of differential characteristics of the measured HF vs. SOC present characteristics and a length mAh of a line segment between peaks of differential characteristics of the HF vs. SOC initial characteristics stored in the storage.

The present inventors have focused on an enthalpy potential (UH), which is calculated according to the following formula that is based on a closed circuit voltage CCV, a heat flow HF, and a current I:

$$UH=CCV-HF/I$$

The present inventors have further found the following. The length of a line segment between peaks of UH vs. SOC differential characteristics also correlates with the overall capacity mAh of a battery cell, and in comparison with the CCV vs. SOC differential characteristics, the UH vs. SOC differential characteristics also have feature in which:

peaks have larger magnitudes, shaper spectra, and lager S/N ratios;

the number of the peaks is greater and the intervals between the peaks are shorter; and plus peaks and minus peaks have a respective specific pattern, and even when the battery cells are degraded, the specific pattern maintains a certain pattern, in other words, the peaks are unlikely to deviate in position with respect to the SOC even when the battery cells are degraded.

Accordingly, the present inventors have devised a method of estimating a SOH of a battery cell based on the enthalpy potential UH of the battery cell, specifically, the UH vs. SOC characteristics, and more specifically, the UH vs. SOC differential characteristics.

A battery unit according to a second aspect of the present disclosure includes: a battery module including a battery cell; a battery heat flow detector configured to detect a heat flow of the battery cell; a voltage detector configured to detect a closed circuit voltage of the battery cell; a current detector configured to detect a current of the battery cell; a storage configured to store enthalpy potential UH vs. state of charge SOC initial characteristics of the battery cell, an enthalpy potential UH being calculated according to a formula that is based on a closed circuit voltage CCV, a heat flow HF, and a current I, and is written as UH=CCV−HF/I; and a battery state estimator configured to estimate a state of health SOH of the battery cell. The battery state estimator measures, during charge of the battery cell, UH vs. SoC present characteristics of the battery cell, based on the heat flow HF, the closed circuit voltage CCV, and the current I of the battery cell that are detected by the battery heat flow detector, the voltage detector, and the current detector, respectively, and estimates a second state of health SOH (Ideal; I) of the battery cell, from a ratio between a length mAh of a line segment between peaks of differential characteristics of the measured UH vs. SOC present characteristics and a length mAh of a line segment between peaks of differential characteristics of the UH vs. SOC initial characteristics stored in the storage.

The present inventors focus on an enthalpy potential difference ΔUH calculated by subtracting initial characteristics of the enthalpy potential from present characteristics of the enthalpy potential. The present inventors have found the following. The magnitudes of peaks of ΔUH vs. SOC differential characteristics correlate with the overall capacity mAh of battery cells, and in comparison with the CCV vs. SOC differential characteristics, the ΔUH vs. SOC differential characteristics have features in which peaks have larger magnitudes, shaper spectra, and lager S/N ratios;

the number of the peaks is greater and the intervals between the peaks are shorter; and plus peaks and minus peaks have a respective specific pattern, and even when the battery cells are degraded, the specific pattern maintains a certain pattern, in other words, the peaks are unlikely to deviate in position with respect to the SOC even when the battery cells are degraded.

Accordingly, the present inventors have devised a method of estimating a SOH of a battery cell based on the enthalpy potential difference of the battery cell, specifically the ΔUH vs. SOC characteristics, and more specifically ΔUH vs. SOC differential characteristics.

A battery unit according to a third aspect of the present disclosure includes: a battery module including a battery cell; a battery heat flow detector configured to detect a heat flow of the battery cell; a voltage detector configured to detect a closed circuit voltage of the battery cell; a current detector configured to detect a current of the battery cell; a storage configured to store enthalpy potential UH vs. state of charge SOC initial characteristics of the battery cell, an enthalpy potential UH being calculated according to a formula that is based on a closed circuit voltage CCV, a heat flow HF, and a current I, and is written as UH=CCV−HF/I; and a battery state estimator configured to estimate a state of health SOH of the battery cell. The battery state estimator measures, during charge of the battery cell, UH vs. SOC present characteristics of the battery cell, based on the heat flow HF, the closed circuit voltage ccv, and the current I of the battery cell that are detected by the battery heat flow detector, the voltage detector, and the current detector, respectively, calculates enthalpy potential difference ΔUH vs. SOC characteristics by subtracting the UH vs. SOC initial characteristics stored in the storage from the measured UH vs. SOC present characteristics, and estimates a second state of health SOH(I) of the battery cell, from a magnitude of a peak of differential characteristics of the calculated ΔUH vs. SOC characteristics.

Since the closed circuit voltage CCV or the heat flow HF described above alone includes a resistance loss (IR loss), a SOH estimated from the CCV vs. SOC characteristics or the HF vs. SOC characteristic also include an increase in resistance loss due to an increase in internal resistance R caused by degradation. On the other hand, in the case of the above-described enthalpy potential UH, since the resistance loss included in the CCV and the resistance loss included in the HF are canceled, a SOH estimated from the UH vs. SOC characteristics is an ideal capacity with cancellation of an increase in the resistance loss due to an increase in the internal resistance caused by the degradation. Accordingly, the present inventors have devised a method of estimating an increase in resistance loss due to an increase in an internal resistance caused by degradation, from the first state of health SOH(R) estimated according to the SOH estimation of the first aspect of the present disclosure and the second state of health SOH(I) estimated according to the SOH estimation of the third aspect of the present disclosure.

Specifically, according to a fourth aspect of the present disclosure, the battery unit of the first aspect may further include: a voltage detector configured to detect a closed circuit voltage of the battery cell; and a current detector configured to detect a current of the battery cell. The storage of the battery unit of the first aspect may further store enthalpy potential UH vs. SOC initial characteristics of the battery cell, an enthalpy potential UH being calculated according to a formula that is based on a closed circuit voltage CCV, a heat flow HF, and a current I, and is written as UH=CCV−HF/I. The battery state estimator of the battery unit of the first aspect may further measure, during charge of the battery cell, UH vs. SOC present characteristics of the battery cell, based on the heat flow HF, the closed circuit voltage CCV, and the current I of the battery cell that are detected by the battery heat flow detector, the voltage detector, and the current detector, respectively, may calculate enthalpy potential difference ΔUH vs. SOC characteristics by subtracting the UH vs. SOC initial characteristics stored in the storage from the measured UH vs. SOC present characteristics, may estimate a second state of health SOH(I) of the battery cell, from a magnitude of a peak of differential characteristics of the calculated ΔUH vs. SOC characteristics, and may estimate an increase in resistance loss (IR loss) caused by degradation of the battery cell, from a difference between the first state of health SOH(R) and the second state of health SOH(I).

According to a fifth aspect of the present disclosure, in the battery unit of the third or fourth aspect, the storage may store in advance differential characteristics of the ΔUH vs. SOC characteristics in a predetermined second state of health SOH(I) of the battery cell, and the battery state estimator may assume, from a magnitude of a peak of the differential characteristics of the ΔUH vs. SOC characteristics in the predetermined second state of health SOH(I) stored in the storage, that there is a proportional relationship between the second state of health SOH(I) and the magnitude of the peak, and may estimate, based on the proportional relationship, the second state of health SOH(I) of the battery cell, from the magnitude of the peak of the differential characteristics of the calculated ΔUH vs. SOC characteristics.

According to a sixth aspect of the present disclosure, the battery unit may further includes a reference heat flow detector configured to detect, as a reference heat flow, a heat flow of the battery unit, and the battery state estimator of the battery unit may subtract the reference heat flow detected by the reference heat flow detector from the heat flow detected by the battery heat flow detector to thereby calculate a heat flow excluding effects of the heat flow in the battery unit, and may use the calculated heat flow as the heat flow of the battery cell.

The first to third and fifth aspects of the present disclosure make it possible to estimate the SOH of the battery cell with improved accuracy, in comparison with a case of estimating the SOH based on CCV vs. SOC differential characteristics.

The second and third aspects of the present disclosure enable an ideal estimation of SOH based on degradation of capacity and excluding degradation associated with resistance. The fourth aspect of the present disclosure makes it possible to estimate an increase in resistance loss (IR loss) due to an increase in an internal resistance R caused by degradation. The sixth aspect of the present disclosure, which is based on the heat flow excluding noise generated in the battery unit, makes it possible to further improve accuracy of estimation of the SOH of the battery cell.

BRIEF DESCRIPTION OF THE DRAWINGS

FIG. 3A illustrates, as an example, HF vs. SOC characteristics and UH vs. SOC characteristics in an initial state of the embodiment;

FIG. 3B illustrates, as an example, HF vs. SOC characteristics and UH vs. SOC characteristics in a low degradation state of the embodiment;

FIG. 3D illustrates, in a superimposed manner, the HF vs. SOC characteristics in the initial state shown in FIG. 3A, the HF vs. SOC characteristics in the low degradation state shown in FIG. 3B, and the HF vs. SOC characteristics in the intermediate degradation state shown in FIG. 3C;

DETAILED DESCRIPTION OF THE INVENTION

Figure 1:
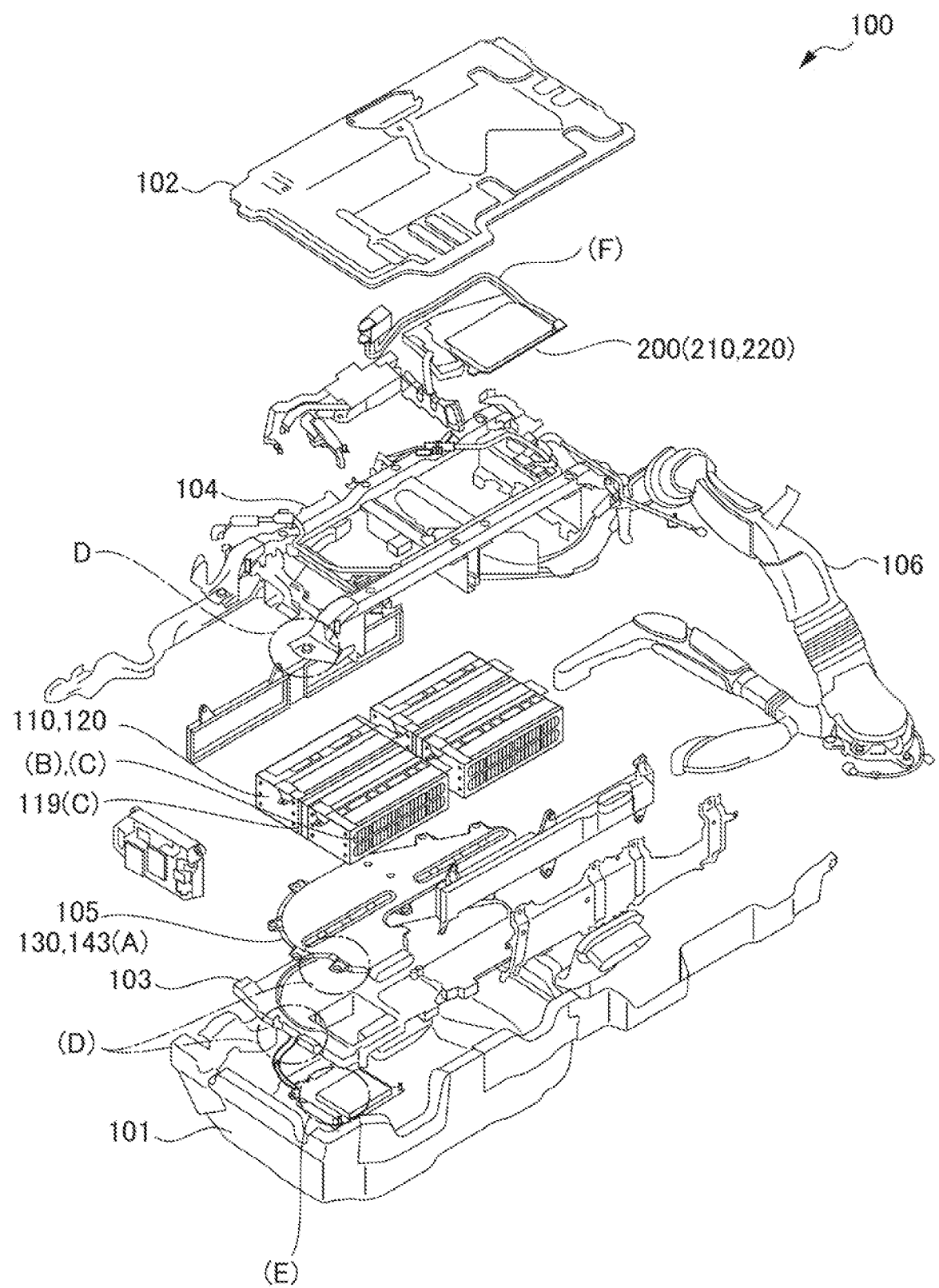
FIG. 1 is an exploded perspective view illustrating a battery unit according to an embodiment.

An example of embodiments of the present disclosure will be described below with reference to the accompanying drawings. In the drawings, the same or equivalent components are denoted by the same reference character.

(Battery Unit)

Figure 2A:
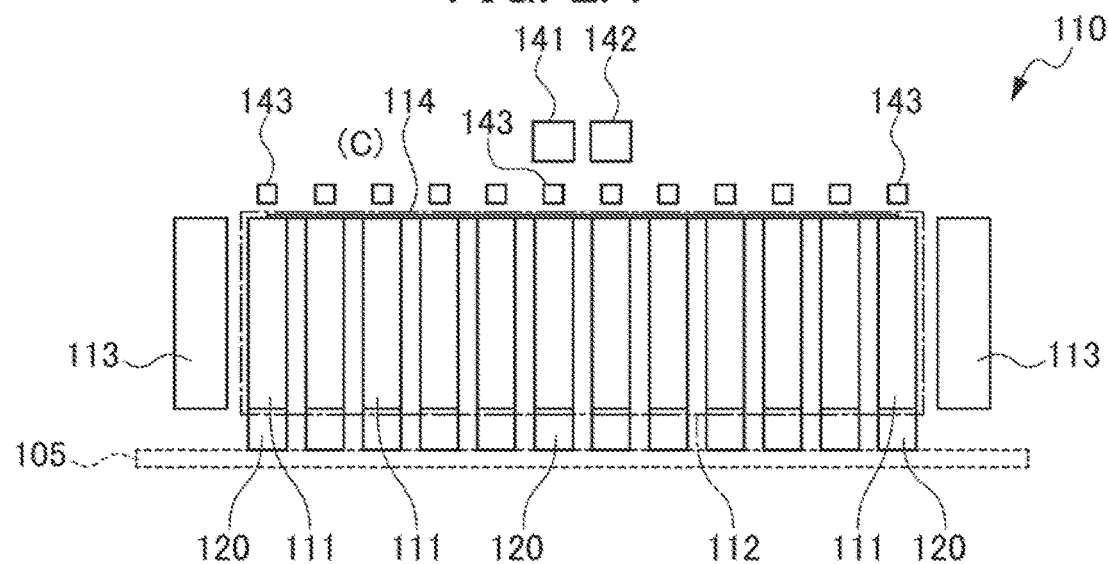
FIG. 2A is a side view of an example of a battery module in the battery unit illustrated in FIG. 1.

FIG. 1 is an exploded perspective view illustrating a battery unit according to the present embodiment. FIG. 2A is a side view illustrating an example of a battery module that can be included in the battery unit illustrated in FIG. 1. The battery unit 100 illustrated in FIG. 1 is a battery pack (also referred to as an intelligent power unit: IPU) mountable on an electric vehicle, such as a hybrid electric vehicle (HEV), a hybrid electric vehicle with an external power supply function (plug-in hybrid electric vehicle: PHEV), or a battery electric vehicle (BEV).

As illustrated in FIGS. 1 and 2A, the battery unit 100 includes, as main components, battery modules 110, battery heat flow detectors 120, a reference heat flow detector 130, a voltage detector 141, a current detector 142, temperature detectors 143, and a battery management system (BMS) 200. In the example illustrated in FIG. 1, the components of the battery unit 100 are housed in a case 101 and covered with a cover 102.

In the example illustrated in FIG. 1, the battery unit 100 further includes a lower frame 103 and an upper frame 104. The battery unit 100 further includes a lower cooling plate 105 for cooling the battery modules 110. The battery unit 100 further includes a mechanism 106 (e.g., a fan, a cooling air duct, and an intake duct) that introduces air to cool the battery modules 110.

As illustrated in FIG. 2A, each battery module 110 has, as main components, a stack 112 including a plurality of battery cells 111 stacked together, a pair of end plates 113 sandwiching the stack 112 in the stacking direction, and a cell bus bar 114 connecting the plurality of battery cells 111 to each other. As illustrated in FIG. 1, the plurality of battery modules 110 may be connected to each other via a module bus bar 119.

The battery cells 111 may be any type of battery cell, non-limiting examples of which include lithium-ion batteries. Among such lithium-ion batteries, the following battery is preferable: a lithium-ion battery with a negative electrode containing a material that generates heat due to a phase transition or the like, such as graphite; or a lithium-ion battery with a positive electrode containing a material that generates heat due to a phase transition or the like, such as lithium cobalt oxide (LCO) as a layered compound or lithium nickel oxide (LNO) as a layered compound. In the following, a lithium-ion battery will be described which includes a negative electrode containing graphite as a material that generates heat due to a phase transition or the like; and a positive electrode containing lithium nickel cobalt manganese oxide (NCM) as a layered compound (that is, for the lithium-ion battery to be described below, a SOC of 0% is mainly determined depending on a potential of the negative electrode; negative electrode cut). Note that the present disclosure can be similarly applied to a lithium-ion battery (whose SOC of 0% is mainly determined depending on a potential of the positive electrode; positive electrode cut), which includes a positive electrode containing a material such as LCO or LNO that generates heat due to a phase transition or the like.

The battery heat flow detectors 120 are heat flow sensors that detect a heat flow of the battery cells 111 and the battery unit 100. In other words, the heat flow detected by the battery heat flow detectors 120 is composed of not only the heat flow of the battery cells 111, but also a heat flow affected by various heat flows in the battery unit 100, namely effects of noise.

The heat flow sensor may be any type of sensor, non-limiting example of which include temperature sensors such as a Peltier element, a thermopile, and a thermocouple. Among these sensors, a Peltier element that has high heat flow sensitivity and can also be used as a temperature control device is preferable. As illustrated in FIG. 2A, a Peltier element for cooling the battery cells 111 may be disposed between the battery cells 111 and the cooling plate 105. In this case, the Peltier element can be used for both heat flow detection and cooling. For example, the Peltier element can be used as a heat flow sensor when a heat flow is to be detected, and otherwise, it can be used as a cooler.

It is only necessary for each battery heat flow detector 120 to be disposed on or adjacent to at least one of the battery cells 111 included in the battery module 110. As illustrated in FIG. 2A, the battery heat flow detectors 120 may be disposed on or adjacent to two of the battery cells 111, the two being located next to the end plates 113. The battery heat flow detector 120 may further be disposed on or adjacent to one battery cell 111 located at the center in the stacking direction of the battery cells 111, in addition to the two battery cells 111 next to the end plates 113.

The reference heat flow detector 130 is a heat flow sensor that detects, as a reference heat flow, a heat flow of the battery unit 100, the heat flow composed of various heat flows in the battery unit 100, namely heat flows of noise.

Similarly to the above, the heat flow sensor may be any type of sensor, non-limiting example of which include temperature sensors such as a Peltier element, a thermopile, and a thermocouple. Among these sensors, the Peltier element is preferable. The Peltier element can be used for both cooling the battery cells 11 and detecting the heat flow.

The reference heat flow detector 130 is disposed in the battery unit 100 at a location where temperature fluctuation is small and heat capacity is large. For example, the reference heat flow detector(s) 130 can be disposed at any of the following locations (A) to (F).

(A) Cooling Plate 105 for Cooling the Battery Modules 110

For example, as illustrated in FIG. 1, the cooling plate 105 is disposed in contact with the bottom surfaces of the battery modules 110, and the reference heat flow detector 130 is disposed on or adjacent to a surface of the cooling plate 105, the surface not facing the bottom surfaces of the battery cells 111. Although the reference heat flow detector 130 can be disposed at any position with respect to the plurality of battery cells 111, it may be disposed at, for example, a position corresponding to one battery cell 111 at the center in the stacking direction of the battery cells 111.

(B) End Plates 113 of the Battery Modules 110

Figure 2B:
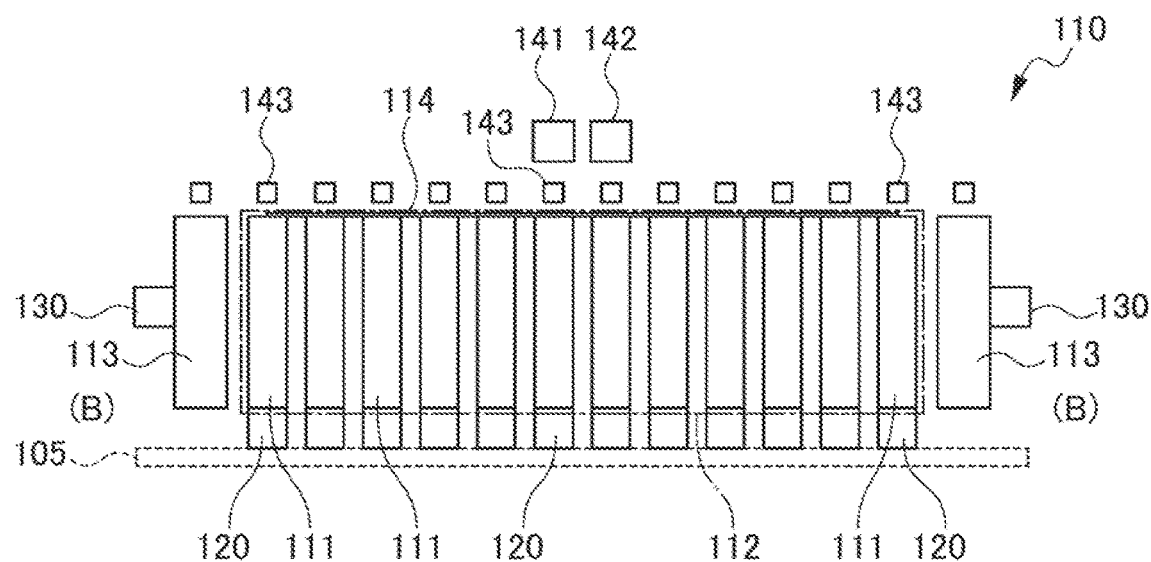
FIG. 2B is a side view of another example of the battery module in the battery unit illustrated in FIG. 1.

FIG. 2B is a side view illustrating another example of a battery module that can be included in the battery unit illustrated in FIG. 1. As illustrated in FIG. 2B, for example, the reference heat flow detector 130 may be disposed on or adjacent to a surface of each end plate 113, the surface not facing the battery cells 111.

(C) Bus Bar 114, 119 of the Battery Modules 110

For example, the reference heat flow detector 130 may be disposed on or adjacent to a surface of the cell bus bar 114 connecting the battery cells to each other (see FIG. 2A), the surface not facing the battery cells 111. For example, the reference heat flow detector 130 may be disposed on or adjacent to a surface of the module bus bar 119 connecting the battery modules 110 to each other (see FIG. 1), the surface not facing the battery cells 111. Although the reference heat flow detector 130 can be disposed at any position with respect to the plurality of battery cells 111, it may be disposed at, for example, a position corresponding to one battery cell 111 at the center in the stacking direction of the battery cells 111.

(D) Flange in the Battery Unit 100

For example, as illustrated in FIG. 1, the reference heat flow detector 130 may be disposed on or adjacent to a flange (joint) which is provided in the battery unit 100 and via which the battery modules are fixed.

(E) Space within the Battery Unit 100

For example, as illustrated in FIG. 1, the reference heat flow detector 130 may be disposed in a floating manner in a space within the battery unit 100.

(F) Pipe Protecting a High-Voltage Conductor Wire

For example, as illustrated in FIG. 1, the reference heat flow detector 130 may be disposed inside or outside a pipe that protects a high-voltage conductor wire (e.g., inside the pipe if the pipe is exposed to outside air, or outside the pipe if the pipe is not exposed to outside air).

The battery heat flow detectors 120 may be disposed on or adjacent to the two battery cells 111 that are next to the end plates 113, and the reference heat flow detector 130 may be disposed on or adjacent to one of the battery cells 111 that is different from the two on or adjacent to which the battery heat flow detectors 120 are disposed (e.g., one battery cell 111 located at the center in the stacking direction of the battery cells 111).

The voltage detector 141 is a voltage sensor that detects a closed circuit voltage of the battery cells 111. The voltage detector 141 may be disposed at any location. For example, as illustrated in FIG. 2A, the voltage detector 141 may be disposed on or adjacent to the battery module 110.

The current detector 142 is a current sensor that detects a current of the battery cells 111. The current detector 142 may be disposed at any location. For example, as illustrated FIG. 2A, the current detector 142 may be disposed on or adjacent to the battery module 110.

The temperature detectors 143 are temperature sensors that detect temperatures of the respective components. The temperature sensor may be any type of temperature sensor, a non-limiting example of which includes a thermocouple. As illustrated in FIG. 2A, each temperature detector 143 is disposed on or adjacent to an associated one of the battery cells 111 and detects the temperature of the associated battery cell 111. The temperature detectors 143 are also disposed at the positions where the battery heat flow detectors 120 are disposed, and detect temperatures of the heat flow detection positions. As illustrated in FIGS. 1 and 2B, the temperature detectors 143 are also disposed at the positions where the reference heat flow detectors 130 are disposed, and detect temperatures of the heat flow detection positions.

(Battery Management System: Battery State Estimator)

The battery management system (BMS, also referred to as the electronic control unit: ECU) 200 performs overall control of the battery cells 111, including charge/discharge control, over-charge protection, over-discharge protection, and monitoring of a state of the battery (e.g., a state of charge (SOC) or a state of health (SOH)) of the battery cells 111. The battery management system 200 includes, as main components, a battery state estimator 210 and a storage 220.

The battery state estimator 210 includes, for example, an arithmetic processor, such as a digital signal processor (DSP) and a field-programmable gate array (FPGA). The battery state estimator 210 performs various functions by executing, for example, predetermined software (programs) stored in the storage 220. The various functions of the battery state estimator 210 may be performed by way of cooperation of hardware and software, or may be performed only by hardware (electronic circuitry).

For example, the storage 220 is a rewritable memory, such as an EEPROM. The storage 220 stores the predetermined software (programs) for allowing the battery state estimator 210 to perform the above-mentioned various functions.

As illustrated in FIG. 3A, the storage 220 stores, in a table map format, characteristics relating to a correlation between a heat flow HF and the SOC of the battery cells 111 in an initial state (HF vs. SOC initial characteristics), which are a plurality of characteristics of the battery cells 111 each associated with a temperature and a current (charge). As illustrated in FIG. 3A, the storage 220 stores, in a table map format, characteristics relating to a correlation between an enthalpy potential UH and the SOC of the battery cells 111 in the initial state (UH vs. SOC initial characteristics), which are a plurality of characteristics of the battery cells 111 each associated with a temperature and a current (charge). As illustrated in FIG. 3A, the storage 220 may store, in a table map format, characteristics relating to a correlation between a closed circuit voltage CCV and the SOC of the battery cells 111 in the initial state (CCV vs. SOC initial characteristics), which are a plurality of characteristics of the battery cells 111 each associated with a temperature and a current (charge).

Here, the enthalpy potential UH is a parameter calculated according to the following formula that is based on the heat flow HF, the closed circuit voltage CCV, and a current I of the battery cells 111 (see Non-Patent Document 1).

$$UH = CCV - HF/I$$

Figure 3C:
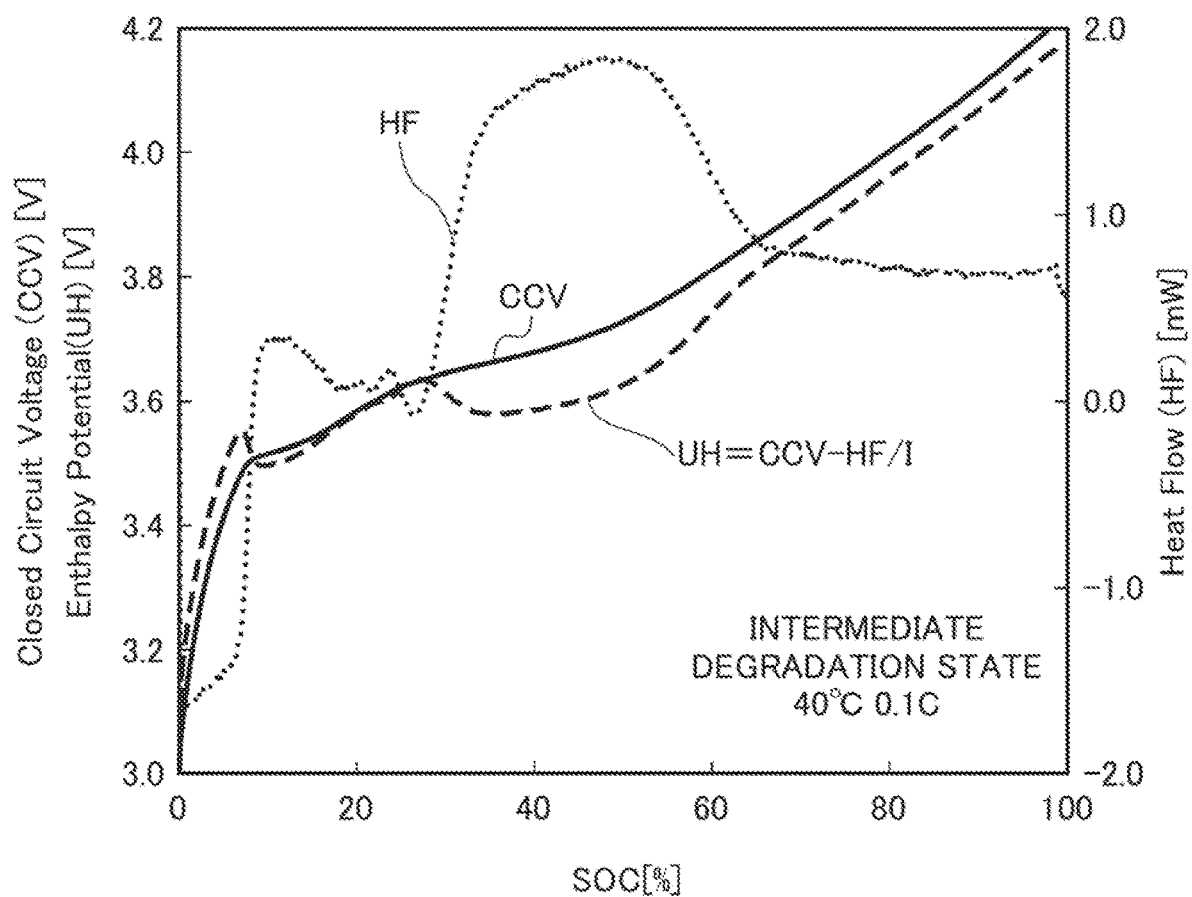
FIG. 3C illustrates, as an example, HF vs. SOC characteristics and UH vs. SOC characteristics in an intermediate degradation state of the embodiment.

As illustrated in FIGS. 3B and 3C, the battery state estimator 210 measures heat flow HF vs. SOC actual characteristics of the battery cells 111 at the time of charge during actual use, for example. The battery state estimator 210 estimates a state of health SOH of the battery cells based on the measured HF vs. SOC actual characteristics and the HF vs. SOC initial characteristics stored in the storage 220. The details of this estimation (SOH Estimation 1) will be described later.

As illustrated in FIGS. 3B and 3C, the battery state estimator 210 measures enthalpy potential UH vs. SOC actual characteristics of the battery cells 111 at the time of charge during actual use, for example. The battery state estimator 210 estimates a state of health SOH of the battery cells based on the measured UH vs. SOC actual characteristics and the UH vs. SOC initial characteristics stored in the storage 220. The details of this estimation (SOH Estimation 2) will be described later.

Note that as the heat flow HF of the battery cells 111, a heat flow detected by the battery heat flow detector 120 may be used as it is. Alternatively, as the heat flow HF of the battery cells 111, a heat flow calculated by subtracting a reference heat flow detected by the reference heat flow detector 130 from a heat flow detected by the battery heat flow detector 120 may be used. This makes it possible to determine the heat flow of the battery cells 111 excluding effects of various heat flows in the battery unit 100, that is, excluding the effects of noise. A heat flow of the battery cells 111 on the positive electrode side and a heat flow of the battery cells 111 on the negative electrode side may be averaged to be defined as the heat flow HF of the battery cells 111.

Here, the SOH is defined by the following formula:

SOH={present(degraded state)full charge capacity (SOC 0%-100%)}/{initial full charge capacity (SOC 0%-100%)}

Thus, the simplest SOH estimation has conventionally been performed in such a manner that the initial full charge capacity (SOC 01-100%) is stored in advance, the present (degraded state) full charge capacity (SOC 0$-100%) is measured at the time of actual use, and the SOH is estimated according to the above formula.

However, during actual use, charge is not carried out from a SOC of 0%. Further, during actual use, charge is not always carried out until a SOC of 100% is reached. Therefore, in order to measure a present (degraded state) full charge capacity (SOC 0%-100%), it is necessary, for example, to stop the use of battery cells, discharge the battery cells until a SOC of 0% is reached, and then charge them until the SOC reaches 100% from 0%. By performing charge with a constant current and at a low rate, the capacity mAh can be calculated from the charge current mA and the charge time h.

Figure 7:
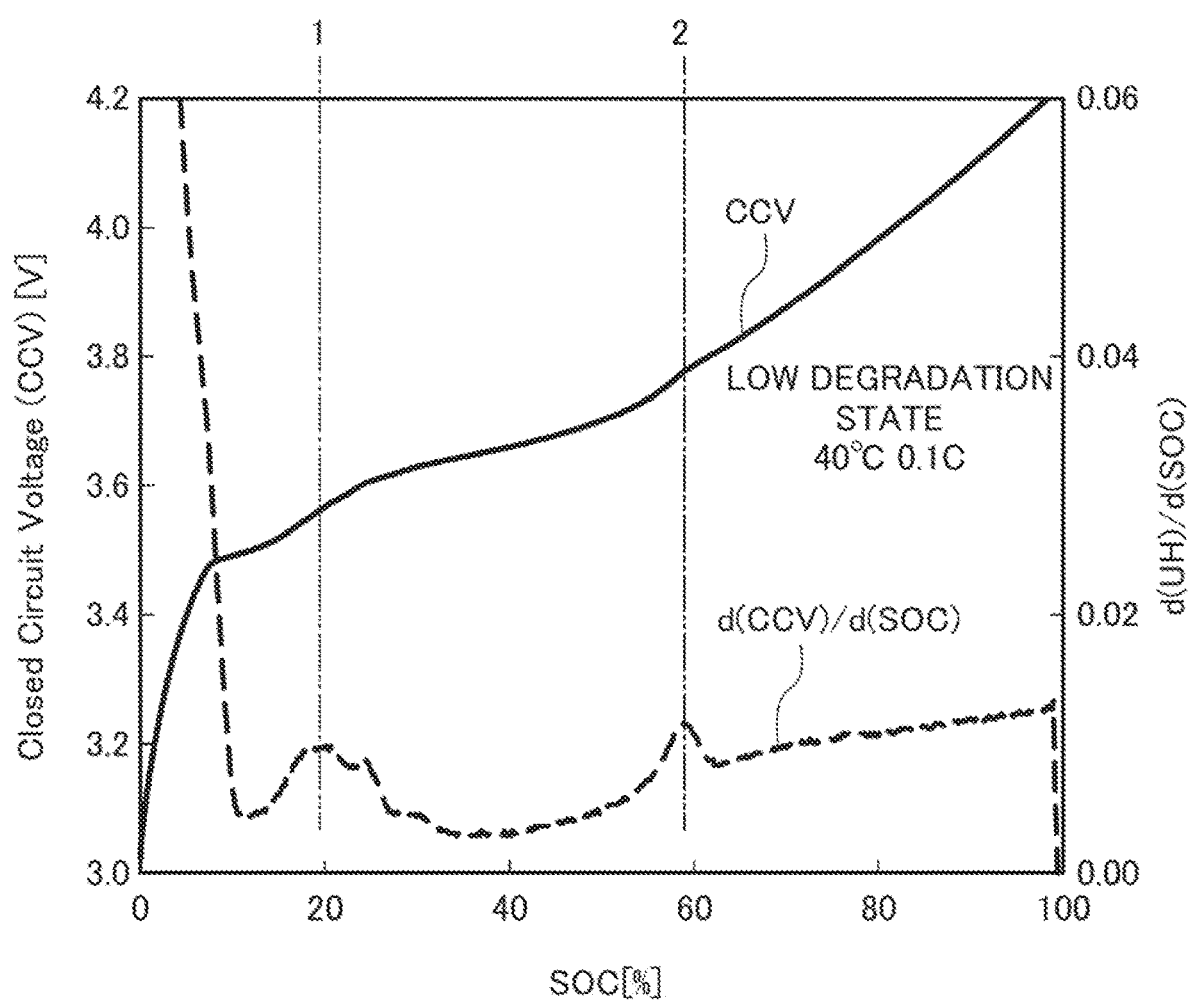
FIG. 7 illustrates, as an example, CCV vs. SOC differential characteristics (in a low degradation state) of a comparative example.

In this respect, the present inventors have devised the process for estimating the SOH based on a part of the CCV vs. SOC characteristics. FIG. 7 is a graph corresponding to a Comparative Example and shows, as an example, the CCV vs. SOC characteristics and differential characteristics thereof, i.e., differential characteristics d(CCV)/d(SOC) of CCV characteristics CCV=f(SOC) with respect to the SOC. As illustrated in FIG. 7, for example, in the case of a lithium-ion battery including graphite as a material for the negative electrode and NCM as a material for the positive electrode, the CCV vs. SOC differential characteristics have a plurality of peaks due to phase transition or the like corresponding to graphite. However, two peaks are clear among the plurality of peaks.

In the case of a lithium-ion battery of the type of negative electrode cut, the length of the line segment between these peaks correlates with the overall capacity of the battery cells. Therefore, if the length mAh of the line segment between the peaks is known, the overall capacity mAh of the battery cells can be calculated. For example, it is assumed that the initial capacity for SOC 0%-100% is 100 mAh, and the length of the line segment between peaks is 40 mAh. The length mAh of the line segment between the peaks may be suitably calculated from the charge current and the charge time. When degradation of the battery cells progresses and the length of the line segment between peaks decreases to 20 mAh, the overall capacity of the battery cells becomes equal to 50 mAh.

Therefore, according to the SOH estimation of the Comparative Example, a length mAh of a line segment between peaks of the differential characteristics of the CCV vs. SOC initial characteristics is stored in advance, a length mAh of a line segment between peaks of the differential characteristics of the CCV vs. SOC present (degraded state) characteristics is measured at the time of charge during actual use, and the SOH is estimated according to the following formula:

SOH={length mAh of line segment between peaks of differential characteristics of CCV vs. SOC present(degraded state)characteristics}/{length mAh of line segment between peaks of differential characteristics of CCV vs. SOC initial characteristics}

Since the charge is performed with a constant current and at a low rate during actual use, the length mAh of the line segment between the peaks can be determined from the charge current mA and the charge time h. This SOH estimation according to the Comparative Example does not require charge to be carried out from a SOC of 0%, or up to a SOC of 100%, and therefore, can be employed at the time of charge during actual use.

However, in the case of the CCV vs. SOC differential characteristics, the peaks have relatively small magnitudes, relatively obtuse spectra, and relatively small S/N ratios. For this reason, it is expected that a relatively low estimation accuracy can be achieved by the devised process for estimating the SOH of battery cells based on the CCV vs. SOC differential characteristics.

The present inventors have found that a SOC of battery cells correlates also with a heat flow HF of the battery cells that is caused by, for example, phase transition of an active material of an electrode material. The present inventors have further found the following. The length mAh of a line segment between peaks of HF vs. SOC differential characteristics correlates with the overall capacity mAh of battery cells, and in comparison with the CCV vs. SOC differential characteristics, the HF vs. SOC differential characteristics have feature in which:

peaks have larger magnitudes, shaper spectra, and lager S/N ratios;

the number of the peaks is greater and the intervals between the peaks are shorter; and plus peaks and minus peaks have a respective specific pattern, and even when the battery cells are degraded, the specific pattern maintains a certain pattern, in other words, the peaks are unlikely to deviate in position with respect to the SOC even when the battery cells are degraded.

Accordingly, the present inventors have devised a method of estimating a SOH of battery cells based on the heat flow of the battery cells, specifically, the HF vs. SOC characteristics, and more specifically, the HF vs. SOC differential characteristics (SOH Estimation 1 to be described later).

Furthermore, the present inventors have found the following. The length mAh of a line segment between peaks of UH vs. SOC differential characteristics also correlates with the overall capacity mAh of the battery cells, and in comparison with the CCV vs. SOC differential characteristics, the UH vs. SOC differential characteristics also have feature in which:

peaks have larger magnitudes, shaper spectra, and lager S/N ratios;

the number of the peaks is greater and the intervals between the peaks are shorter; and plus peaks and minus peaks have a respective specific pattern, and even when the battery cells are degraded, the specific pattern maintains a certain pattern, in other words, the peaks are unlikely to deviate in position relative to the SOC even when the battery cells are degraded.

Accordingly, the present inventors have devised a method of estimating a SOH of battery cells based on the enthalpy potential of the battery cells, specifically, the UH vs. SOC characteristics, and more specifically, the UH vs. SOC differential characteristics (SOH Estimation 2 to be described later).

Here, a capacity to be actually measured includes a resistance loss (IR loss) due to an internal resistance R of the battery cells, as described below.

Actual capacity=ideal capacity+resistance loss

The internal resistance of the battery cells increases as degradation progress, whereby the resistance loss increases as degradation progresses.

Since the closed circuit voltage CCV or the heat flow HF described above alone includes a resistance loss (IR loss), a SOH estimated from the CCV vs. SOC characteristics or the HF vs. SOC characteristics also includes an increase in resistance loss due to an increase in the internal resistance R caused by the degradation. On the other hand, in the case of the above-described enthalpy potential UH, since the resistance loss included in the CCV and the resistance loss included in the HF are canceled, a SOH estimated from the UH vs. SOC characteristics is an ideal capacity with cancellation of an increase in the resistance loss due to an increase in the internal resistance caused by the degradation.

Accordingly, in the following description, a SOH estimated from the HF is defined as SOH(R), and a SOH estimated from the UH is defined as SOH(I), so that the estimated states of health may be distinguished from each other.

(SOH Estimation 1)

First, described is an example of estimation of the SOH of the battery cells 111 that the battery state estimator 210 performs based on the heat flow HF of the battery cells 111, specifically, the HF vs. SOC characteristics, and more specifically, the HF vs. SOC differential characteristics.

The battery state estimator 210 periodically measures HF vs. SoC present characteristics at the time of charge during actual use. The battery state estimator 210 estimates a state of health SOH(R) of the battery cells based on the measured HF vs. SOC present characteristics shown in FIG. 3B or 3C and the previously stored HF vs. SOC initial characteristics shown in FIG. 3A. FIG. 3D shows, in a superimposed manner, the HF vs. SOC initial characteristics shown in FIG. 3A, the HF vs. SOC characteristics in the low degradation state shown in FIG. 3B, and the HF vs. SOC characteristics in the intermediate degradation state shown in FIG. 3C.

Figure 4:
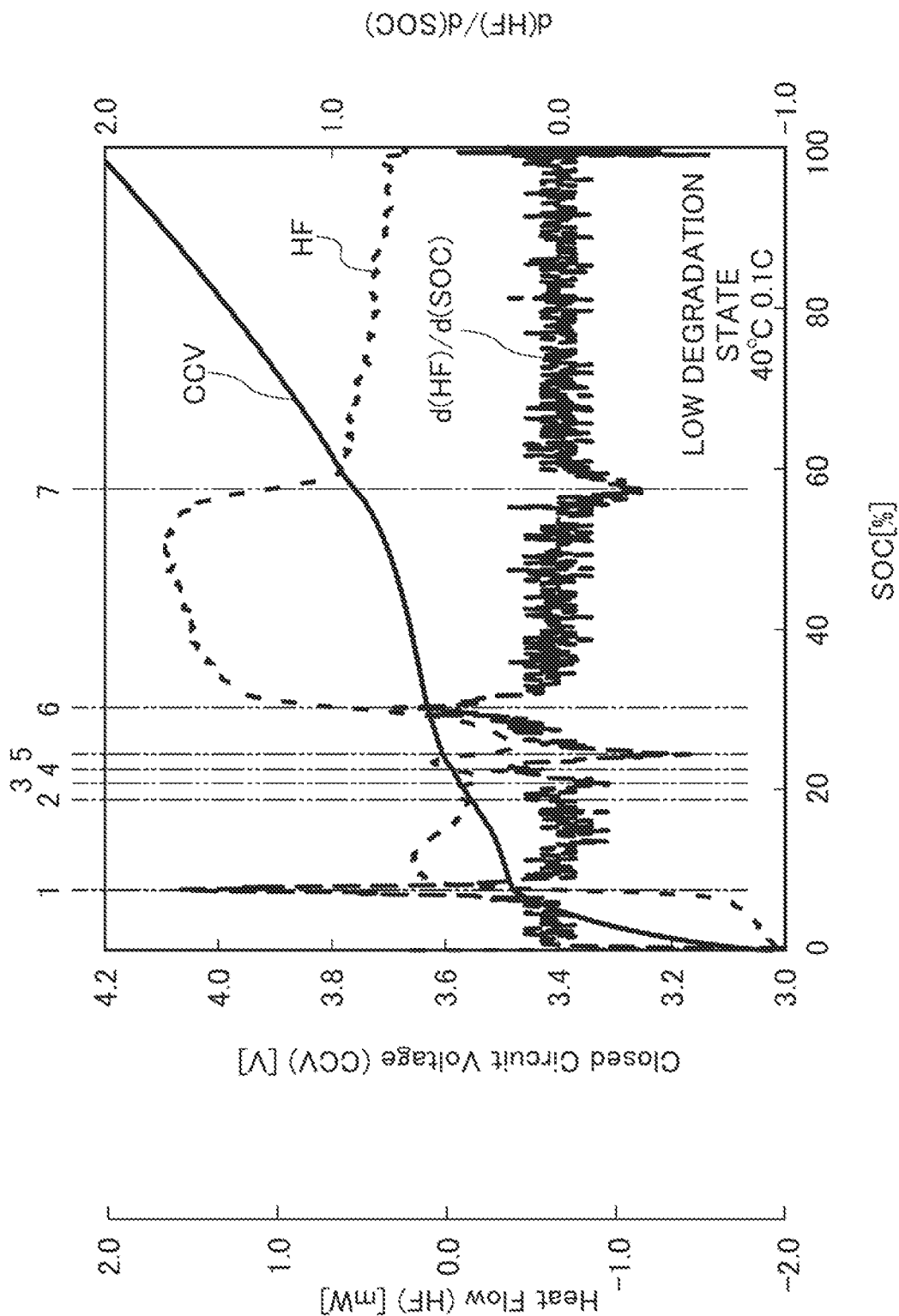
FIG. 4 illustrates, as an example, HF vs. SOC differential characteristics (in a low degradation state) of the embodiment.

Here, FIG. 4 is a graph corresponding to the present embodiment, and shows, as an example, the HF vs. SOC characteristics and the differential characteristics thereof, i.e., differential characteristics d(HF)/d(SOC) of HF characteristics HF=f(SOC) with respect to the SOC. As shown in FIG. 4, in the case of, for example, a lithium-ion battery including graphite as a material for the negative electrode and NCM as a material for the positive electrode, the HF vs. SOC differential characteristics have a plurality of peaks 1 to 7 caused by, for example, phase transition of the graphite.

The lengths of line segments between these peaks correlate with the overall capacity of the battery cells in the case of a lithium-ion battery of the type of negative electrode cut. Therefore, if the lengths mAh of the line segments between these peaks are known, the overall capacity mAh of the battery cells can be calculated. For example, it is assumed that the initial capacity for SOC 0%-100% is 100 mAh, and the length of the line segment between arbitrary two peaks among the plurality of peaks is 20 mAh. The length mAh of the line segment between the peaks can be suitably calculated from the charge current and the charge time. When the degradation of the battery cells progresses and the length of the line segment between the two peaks decreases to 10 mAh, the overall capacity of the battery cells becomes equal to 50 mAh.

Therefore, according to the SOH estimation of the present embodiment, the battery state estimator 210 stores in advance the lengths mAh of the line segments between the peaks of the differential characteristics of the HF vs. SOC initial characteristics. The battery state estimator 210 measures the length mAh of the line segment between arbitrary two peaks of the differential characteristics of the HF vs. SOC present (degraded state) characteristics at the time of charge during actual use, and estimates a SOH according to the following formula.

SOH={length mA*h* of line segment between two
peaks of differential characteristics of HF vs.
SOC present(degraded state)characteristics}/
{length mA*h* of line segment between two
peaks of differential characteristics of HF vs.
SOC initial characteristics}

Since charge is carried out with a constant current and at a low rate during actual use, the length mAh of the line segment between the peaks can be calculated from the charge current mA and the charge time h.

The SOH estimation of the present embodiment does not require charge to be carried out from a SOC of 0% or up to a SOC of 100%, like the SOH estimation of the above-described Comparative Example, which is based on the length mAh of the line segment between the peaks of the CCV vs. SOC differential characteristics. Therefore, the SOH estimation of the present embodiment can be employed at the time of charge during actual use.

According to the SOH estimation of the present embodiment, the SOH of the battery cells is estimated based on the HF vs. SOC differential characteristics, instead of the CCV vs. SOC differential characteristics. As described above, in comparison with the CCV vs. SOC differential characteristics, the HF vs. SOC differential characteristics have the features in which peaks have larger magnitudes, shaper spectra, and lager S/N ratios;

the number of the peaks is greater and the intervals between the peaks are shorter; and plus peaks and minus peaks have a respective specific pattern, and even when the battery cells are degraded, the specific pattern maintains a certain pattern, in other words, the peaks are unlikely to deviate in position relative to the SOC even when the battery cells are degraded.

For these reasons, the SOH of the battery cells can be estimated with improved accuracy. In particular, the large number of peaks that are present with short intervals interposed therebetween allows estimation of the SOH even at the time of charge from various states of charge during actual use and even at the time of short-time charge during actual use.

With respect to the estimation of the SOC and SOH, it is generally known to use a technique according to which a mathematical model of a battery cell is constructed and the SOC and SOH are estimated using a state estimator created from the model. This estimation involves a fundamental problem in that when the battery model contains an error, the estimation accuracy decreases. Further, it cannot be determined whether or not the estimated value is correct while a battery is being used. In this regard, the embodiment of the present disclosure, according to which the HF characteristics are measured, makes it possible to correct an error contained in a mathematical model of a battery while the battery is being used.

(SOH Estimation 2)

Next, described is an example of estimation of the SOH of the battery cells 111 that the battery state estimator 210 performs based on the enthalpy potential of the battery cells 111, specifically, the UH vs. SOC characteristics, and more specifically, the UH vs. SOC differential characteristics.

The battery state estimator 210 periodically measures UH vs. SOC present characteristics at the time of charge during actual use. The battery state estimator 210 estimates a state of health SOH(I) of the battery cells based on the measured UH vs. SOC present characteristics shown in FIG. 3B or 3C and the previously stored UH vs. SOC initial characteristics shown in FIG. 3A.

Figure 5:
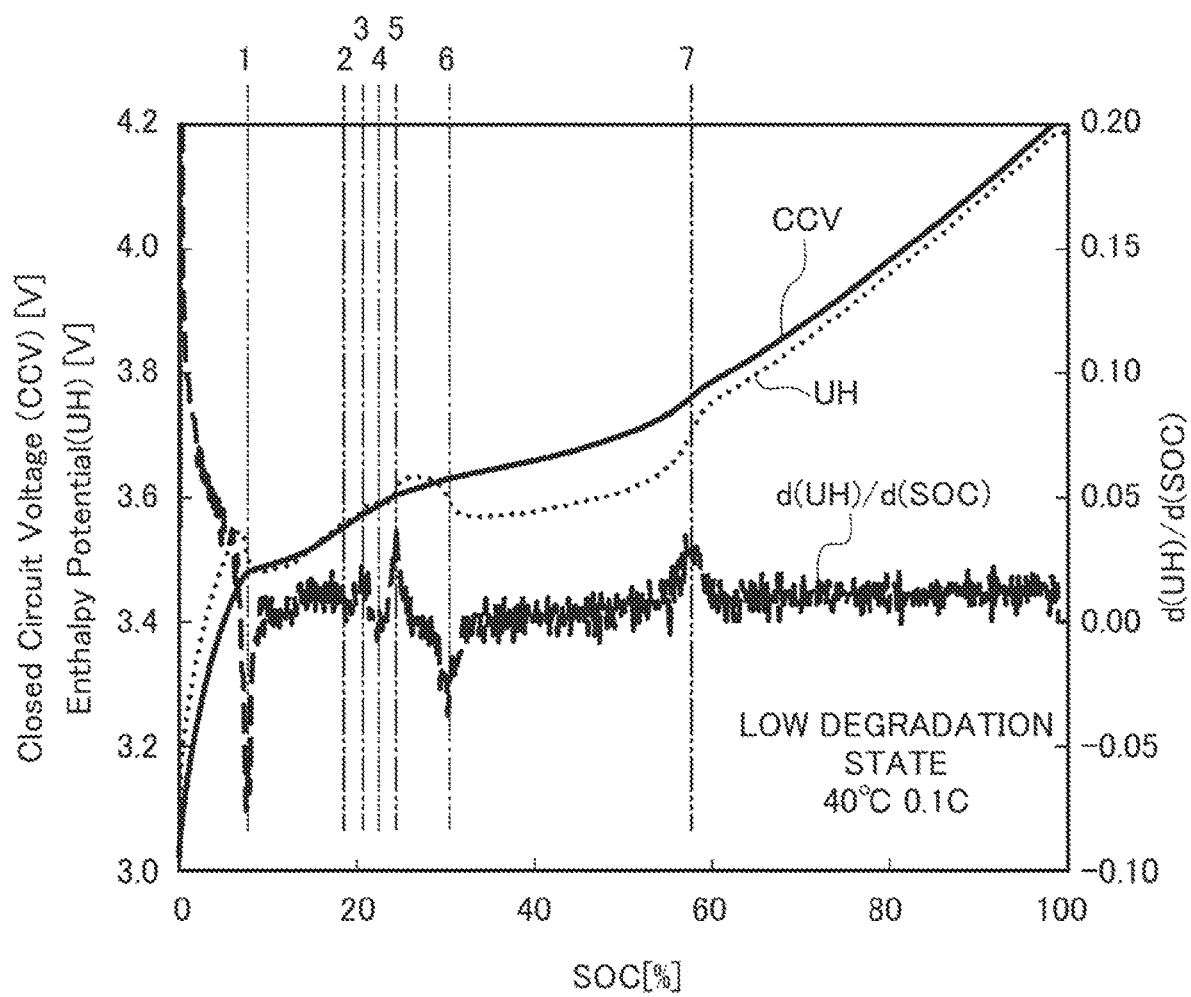
FIG. 5 illustrates, as an example, UH vs. SOC differential characteristics (in a low degradation state) of the embodiment.

Here, FIG. 5 is a graph corresponding to the present embodiment, and shows, as an example, the UH vs. SOC characteristics and the differential characteristics thereof, i.e., differential characteristics d(UH)/d(SOC) of UH characteristics UH=f(SOC) with respect to the SOC. As shown in FIG. 5, in the case of, for example, a lithium-ion battery including graphite as a material for the negative electrode and NCM as a material for the positive electrode, the UH vs. SOC differential characteristics also have a plurality of peaks 1 to 7 caused by, for example, phase transition of the graphite.

The lengths of line segments between these peaks correlate with the overall capacity of the battery cells. Therefore, if the lengths mAh of the line segments between these peaks are known, the overall capacity mAh of the battery cells can be calculated. For example, it is assumed that the initial capacity for SOC 0%-100% is 100 mAh, and the length of the line segment between arbitrary two peaks among the plurality of peaks is 20 mAh. The length mAh of the line segment between the peaks can be suitably calculated from the charge current and the charge time. When the degradation of the battery cells progresses and the length of the line segment between the two peaks decreases to 10 mAh, the overall capacity of the battery cells becomes equal to 50 mAh.

Therefore, according to the SOH estimation of the present embodiment, the battery state estimator 210 stores in advance the lengths mAh of the line segments between the peaks of the differential characteristics of the UH vs. SOC initial characteristics. The battery state estimator 210 measures the length mAh of the line segment between arbitrary two peaks of the differential characteristics of the UH vs. SOC present (degraded state) characteristics at the time of charge during actual use, and estimates a SOH according to the following formula.

SOH={length mA*h* of line segment between two peaks of differential characteristics of *UH* vs. SOC present(degraded state)characteristics}/ {length mA*h* of line segment between two peaks of differential characteristics of *UH* vs. SOC initial characteristics}

Since charge is carried out with a constant current and at a low rate during actual use, the length mAh of the line segment between the peaks can be calculated from the charge current mA and the charge time h.

The SOH estimation of the present embodiment does not require charge to be carried out from a SOC of 0% or up to a SOC of 100%, like the SOH estimation of the above-described Comparative Example, which is based on the length mAh of the line segment between the peaks of the CCV vs. SOC differential characteristics. Therefore, the SOH estimation of the present embodiment can be employed at the time of charge during actual use.

According to the SOH estimation of the present embodiment, the SOH of the battery cells is estimated based on the UH vs. SOC differential characteristics, instead of the CCV vs. SOC differential characteristics. As described above, in comparison with the CCV vs. SOC differential characteristics, the UH vs. SOC differential characteristics also have the features in which
peaks have larger magnitudes, shaper spectra, and lager S/N ratios;
the number of the peaks is greater and the intervals between the peaks are shorter; and
plus peaks and minus peaks have a respective specific pattern, and even when the battery cells are degraded, the specific pattern maintains a certain pattern, in other words, the peaks are unlikely to deviate in position relative to the SOC even when the battery cells are degraded.
For these reasons, the SOH of the battery cells can be estimated with improved accuracy. In particular, the large number of peaks that are present with short intervals interposed therebetween allows estimation of the SOH even at the time of charge from various states of charge during actual use and even at the time of short-time charge during actual use.

Furthermore, as described above, in the case of the enthalpy potential UH, the resistance loss (IR loss) included in the closed circuit voltage CCV and the resistance loss included in the heat flow HF are canceled. Therefore, a SOH estimated from the UH vs. SOC characteristics is an ideal capacity with cancellation of an increase in the resistance loss due to an increase in the internal resistance caused by the degradation. As a result, the net capacity in a degraded state can be determined.

(Modification of SOH Estimation 2)

With respect to the enthalpy potential based on which SOH Estimation 2 described above is performed, the present inventors focus on an enthalpy potential difference ΔUH calculated by subtracting initial characteristics of the enthalpy potential from present (degraded state) characteristics of the enthalpy potential. The present inventors have found the following. The magnitudes of peaks of ΔUH vs. SOC differential characteristics correlate with the overall capacity mAh of battery cells, and in comparison with the CCV vs. SOC differential characteristics, the ΔUH vs. SOC differential characteristics have features in which
peaks have larger magnitudes, shaper spectra, and lager S/N ratios;
the number of the peaks is greater and the intervals between the peaks are shorter; and
plus peaks and minus peaks have a respective specific pattern, and even when the battery cells are degraded, the specific pattern maintains a certain pattern.
Accordingly, the present inventors have devised a method of estimating a SOH of battery cells based on the enthalpy potential difference of the battery cells, specifically the ΔUH vs. SOC characteristics, and more specifically ΔUH vs. SOC differential characteristics.

As described above, in the case of the enthalpy potential UH, the resistance loss (IR loss) included in the closed circuit voltage CCV and the resistance loss included in the heat flow HF are canceled. Therefore, a SOH estimated from the ΔUH vs. SOC characteristics is an ideal capacity with cancellation of an increase in the resistance loss due to an increase in the internal resistance R caused by the degradation. As a result, the net capacity in a degraded state can be determined.

The battery state estimator 210 periodically measures UH vs. SOC present characteristics at the time of charge during actual use, and calculates the ΔUH vs. SOC characteristics by subtracting the previously stored UH vs. SOC initial characteristics shown in FIG. 3A from the measured UH vs. SOC present characteristics shown in FIG. 3B or 3C. The battery state estimator 210 estimates a state of health SOH(I) of the battery cells based on the calculated ΔUH vs. SOC differential characteristics and ΔUH vs. SOC differential characteristics in a predetermined SOH that have been previously stored.

Figure 6A:
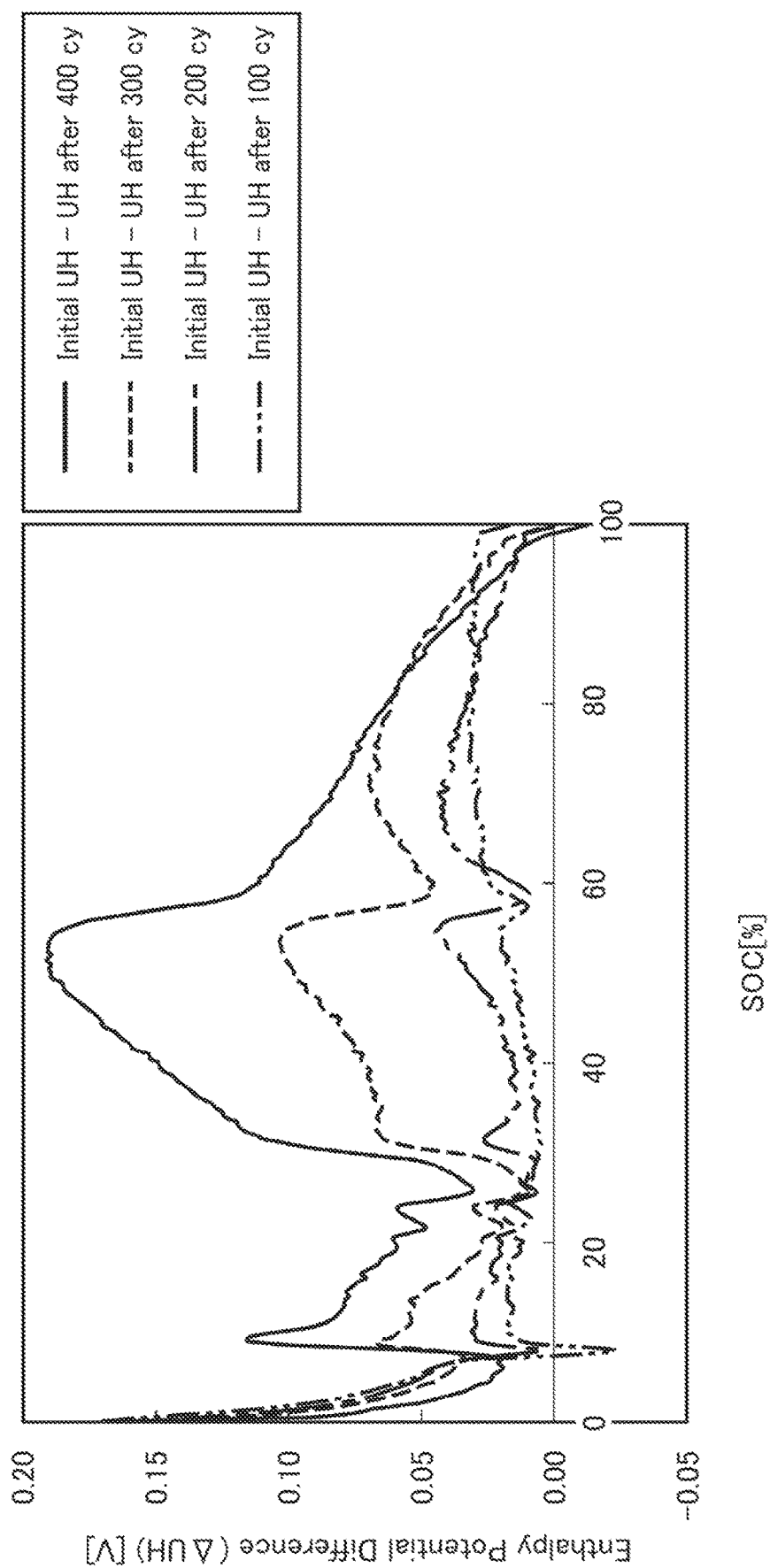
FIG. 6A illustrates, as an example, ΔUH vs. SOC characteristics of the embodiment.
Figure 6B:
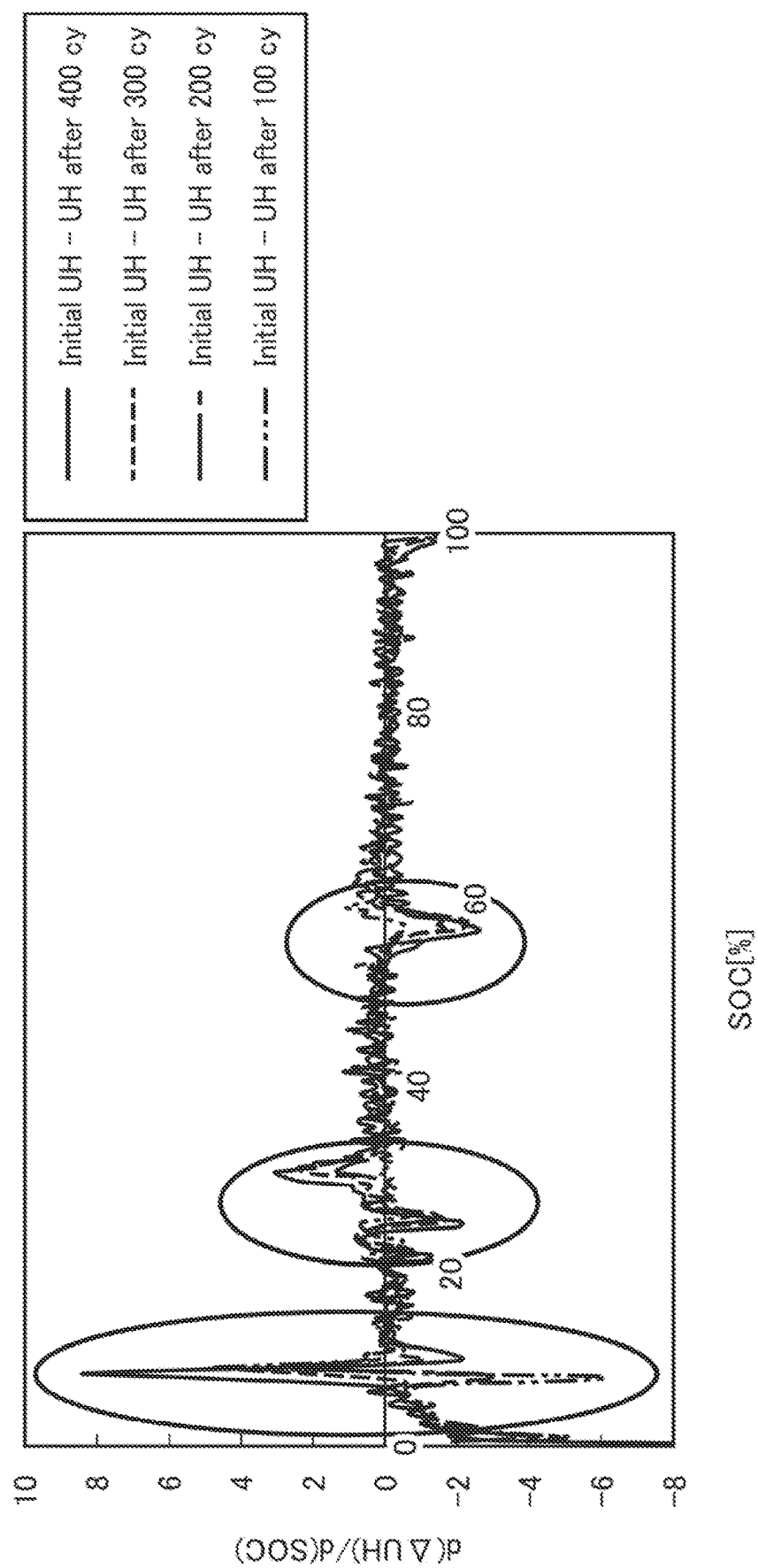
FIG. 6B illustrates, as an example, ΔUH vs. SOC differential characteristics of the embodiment.

FIG. 6A illustrates, as an example, ΔUH vs. SOC characteristics of the present embodiment. FIG. 6B illustrates, as an example, differential characteristics of the ΔUH vs. SOC characteristics of the present embodiment, i.e., differential characteristics d(ΔUH)/d(SOC) of ΔUH characteristics ΔUH=f(SOC) with respect to the SOC. As shown in FIG. 6B, in the case of a lithium-ion battery including graphite as a material for the negative electrode and NCM as a material for the positive electrode, the ΔUH vs. SOC differential characteristics also have a plurality of peaks.

The magnitudes (heights) of these peaks correlate with the overall capacity of the battery cells. Specifically, as the overall capacity of the battery cells decreases due to degradation of the battery cells, the magnitudes of these peaks increase. As described above, the plus peaks and minus peaks have the respective specific pattern. Thus, if the magnitudes and plus or minus of these peaks are known, the overall capacity mAh and the SOH of the battery cells can be calculated.

Therefore, according to the SOH estimation of the present modification, the storage 220 stores in advance the ΔUH vs. SOC differential characteristics in a predetermined SOH, and the battery state estimator 210 assumes, from the magnitude (0) of a peak of ΔUH vs. SOC differential characteristics in an initial state (SOH 100%) and the magnitude of a peak of ΔUH vs. SOC differential characteristics in the predetermined SOH, that there is a proportional relationship between the SOH and the magnitude of the peak.

The battery state estimator 210 calculates enthalpy potential difference ΔUH vs. SOC characteristics by subtracting the UH vs. SOC initial characteristics from the UH vs. SOC present (degraded state) characteristics, at the time of charge during actual use. The battery state estimator 210 estimates the SOH corresponding to the magnitude of one of the peaks of the calculated UH vs. SOC differential characteristics, by referring to the proportional relationship that is based on the ΔUH vs. SOC differential characteristics in the predetermined SOH that have been stored in advance.

As described above, the SOH estimation of the present modification also makes it possible to achieve the same advantages as those of the SOH Estimation 2 of the embodiment described above.

(Modification of SOH Estimation 1)

As described above, the SOH estimated from the magnitude (height) of a peak of the ΔUH vs. SOC differential characteristics shown in FIG. 6B correlates with the length mAh of a line segment between the peaks of the HF vs. SOC differential characteristics shown in FIG. 4. Accordingly, the present inventors have devised a method of estimating an increase in resistance loss due to an increase in internal resistance caused by degradation, based on a SOH(R) that is estimated by way of SOH Estimation 1 described above and includes the increase in resistance loss due to the increase in internal resistance caused by degradation, and a SOH(I) that is estimated by way of SOH Estimation 2 described above and for which the increase in the resistance loss due to the increase in the internal resistance caused by the degradation is canceled.

Specifically, the battery state estimator 210 estimates an increase in resistance loss due to an increase in internal resistance caused by degradation, from a difference between the SOH(R) and the SOH(I), which are estimated by SOH Estimation 1 and SOH Estimation 2 described above, respectively.

The estimated increase in resistance loss due to the increase in internal resistance can be utilized for the following control.

Control of an output voltage of battery cells, in other words, a discharge current, and Control of cooling of battery cells at the time of charge, in other words, heat dissipation from the battery cells.

While embodiments of the present disclosure have been described above, the present disclosure is not limited to the embodiments described above, and various modifications and changes may be made to the present disclosure.

EXPLANATION OF REFERENCE NUMERALS

100: Battery unit
101: Case
102: Cover
103: Lower frame
104: Upper frame
105: Cooling plate
106: Air introduction mechanism
110: Battery module
111: Battery cell
112: Stack
113: End plate
114: Cell bus bar
119: Module bus bar
120: Battery heat flow detector
130: Reference heat flow detector
141: Voltage detector
142: Current detector
143: Temperature detector
200: Battery management system (BMS)
210: Battery state estimator
220 Storage

What is claimed is:

1. A battery unit comprising:
a battery module including a battery cell;
a battery heat flow detector configured to detect a heat flow of the battery cell;
a storage configured to store heat flow HF vs. state of charge SOC initial characteristics of the battery cell; and
a battery state estimator configured to estimate a state of health SOH of the battery cell,
wherein the battery state estimator
measures, during charge of the battery cell, HF vs. SOC present characteristics of the battery cell, based on the heat flow HF of the battery cell detected by the battery heat flow detector, and
estimates a first state of health SOH(R) of the battery cell, from a ratio between a length mAh of a line segment between peaks of differential characteristics of the measured HF vs. SOC present characteristics and a length mAh of a line segment between peaks of differential characteristics of the HF vs. SOC initial characteristics stored in the storage.

2. The battery unit according to claim 1, further comprising:
a voltage detector configured to detect a closed circuit voltage of the battery cell; and
a current detector configured to detect a current of the battery cell,
wherein the storage further stores enthalpy potential UH vs. SOC initial characteristics of the battery cell, an enthalpy potential UH being calculated according to a formula that is based on a closed circuit voltage CCV, a heat flow HF, and a current I, and is written as UH=CCV−HF/I; and
wherein the battery state estimator
further measures, during charge of the battery cell, UH vs. SOC present characteristics of the battery cell, based on the heat flow HF, the closed circuit voltage CCV, and the current I of the battery cell that are detected by the battery heat flow detector, the voltage detector, and the current detector, respectively,
calculates enthalpy potential difference ΔUH vs. SOC characteristics by subtracting the UH vs. SOC initial characteristics stored in the storage from the measured UH vs. SOC present characteristics,
estimates a second state of health SOH(I) of the battery cell, from a magnitude of a peak of differential characteristics of the calculated ΔUH vs. SOC characteristics, and estimates an increase in resistance loss R caused by degradation of the battery cell, from a difference between the first state of health SOH(R) and the second state of health SOH(I).

3. The battery unit according to claim 2,
wherein the storage stores in advance differential characteristics of the enthalpy potential difference ΔUH vs. SOC characteristics in a predetermined second state of health SOH(I) of the battery cell, and
wherein the battery state estimator
assumes, from a magnitude of a peak of the differential characteristics of the ΔUH vs. SOC characteristics in the predetermined second state of health SOH(I) stored in the storage, that there is a proportional relationship between the second state of health SOH(I) and the magnitude of the peak, and
estimates, based on the proportional relationship, the second state of health SOH(I) of the battery cell, from the magnitude of the peak of the differential characteristics of the calculated ΔUH vs. SOC characteristics.

4. The battery unit according to claim 2, further comprising:
a reference heat flow detector configured to detect, as a reference heat flow, a heat flow of the battery unit,
wherein the battery state estimator subtracts the reference heat flow detected by the reference heat flow detector from the heat flow detected by the battery heat flow detector to thereby calculate a heat flow excluding effects of the heat flow in the battery unit, and uses the calculated heat flow as the heat flow of the battery cell.

5. The battery unit according to claim 1, further comprising:
a reference heat flow detector configured to detect, as a reference heat flow, a heat flow of the battery unit,
wherein the battery state estimator subtracts the reference heat flow detected by the reference heat flow detector from the heat flow detected by the battery heat flow detector to thereby calculate a heat flow excluding effects of the heat flow in the battery unit, and uses the calculated heat flow as the heat flow of the battery cell.

6. A battery unit comprising:
a battery module including a battery cell;
a battery heat flow detector configured to detect a heat flow of the battery cell;
a voltage detector configured to detect a closed circuit voltage of the battery cell;
a current detector configured to detect a current of the battery cell;
a storage configured to store enthalpy potential UH vs. state of charge SOC initial characteristics of the battery cell, an enthalpy potential UH being calculated according to a formula that is based on a closed circuit voltage CCV, a heat flow HF, and a current I, and is written as UH=CCV−HF/I; and
a battery state estimator configured to estimate a state of health SOH of the battery cell,
wherein the battery state estimator
measures, during charge of the battery cell, UH vs. SOC present characteristics of the battery cell, based on the heat flow HF, the closed circuit voltage CCV, and the current I of the battery cell that are detected by the battery heat flow detector, the voltage detector, and the current detector, respectively, and
estimates a second state of health SOH(I) of the battery cell, from a ratio between a length mAh of a line segment between peaks of differential characteristics of the measured UH vs. SOC present characteristics and a length mAh of a line segment between peaks of differential characteristics of the UH vs. SOC initial characteristics stored in the storage.

7. The battery unit according to claim 6, further comprising:
a reference heat flow detector configured to detect, as a reference heat flow, a heat flow of the battery unit,
wherein the battery state estimator subtracts the reference heat flow detected by the reference heat flow detector from the heat flow detected by the battery heat flow detector to thereby calculate a heat flow excluding effects of the heat flow in the battery unit, and uses the calculated heat flow as the heat flow of the battery cell.

* * * * *